(12) United States Patent
Horng et al.

(10) Patent No.: US 8,546,953 B2
(45) Date of Patent: Oct. 1, 2013

(54) THROUGH SILICON VIA (TSV) ISOLATION STRUCTURES FOR NOISE REDUCTION IN 3D INTEGRATED CIRCUIT

(75) Inventors: Jaw-Juinn Horng, Hsinchu (TW); Chia-Lin Yu, Sigang Township, Tainan County (TW); Chung-Hui Chen, HsinChu (TW); Der-Chyang Yeh, Hsin-Chu (TW); Yung-Chow Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/324,405

(22) Filed: Dec. 13, 2011

(65) Prior Publication Data

US 2013/0147057 A1 Jun. 13, 2013

(51) Int. Cl.
*H01L 23/48* (2006.01)
*H01L 29/40* (2006.01)
*H01L 23/04* (2006.01)
*H01L 21/44* (2006.01)

(52) U.S. Cl.
USPC .... 257/774; 257/621; 257/698; 257/E23.067; 438/667

(58) Field of Classification Search
USPC ............... 257/276, 341, 401, 621, 698, 774, 257/E23.067; 438/667
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,107,149 A | 8/2000 | Wu et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,563,181 B1 * | 5/2003 | Du et al. ................. 257/394 |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnsorth et al. |

(Continued)

OTHER PUBLICATIONS

Unpublished U.S. Appl. No. 13/167,909, filed Jun. 24, 2011.

*Primary Examiner* — Chuong A Luu
*Assistant Examiner* — Cory Eskridge
(74) *Attorney, Agent, or Firm* — Duane Morris LLP

(57) ABSTRACT

Through silicon via (TSV) isolation structures are provided and suppress electrical noise such as may be propagated through a semiconductor substrate when caused by a signal carrying active TSV such as used in 3D integrated circuit packaging. The isolation TSV structures are surrounded by an oxide liner and surrounding dopant impurity regions. The surrounding dopant impurity regions may be P-type dopant impurity regions that are coupled to ground or N-type dopant impurity regions that may advantageously be coupled to $V_{DD}$. The TSV isolation structure is advantageously disposed between an active, signal carrying TSV and active semiconductor devices and the TSV isolation structures may be formed in an array that isolates an active, signal carrying TSV structure from active semiconductor devices.

20 Claims, 6 Drawing Sheets

(56) References Cited

U.S. PATENT DOCUMENTS

| | | |
|---|---|---|
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,427,803 B2 * | 9/2008 | Chao et al. ............ 257/659 |
| 7,701,057 B1 * | 4/2010 | Rahman et al. ........ 257/750 |
| 2009/0134500 A1 * | 5/2009 | Kuo ........................ 257/659 |
| 2010/0059869 A1 * | 3/2010 | Kaskoun et al. ....... 257/665 |
| 2010/0237386 A1 | 9/2010 | Lin et al. |
| 2011/0095435 A1 * | 4/2011 | Volant et al. ........... 257/774 |
| 2011/0108948 A1 | 5/2011 | Kim et al. |
| 2011/0241185 A1 * | 10/2011 | Koester et al. ......... 257/659 |
| 2012/0061795 A1 | 3/2012 | Yen et al. |
| 2012/0261826 A1 * | 10/2012 | Kuo et al. ............... 257/774 |

* cited by examiner

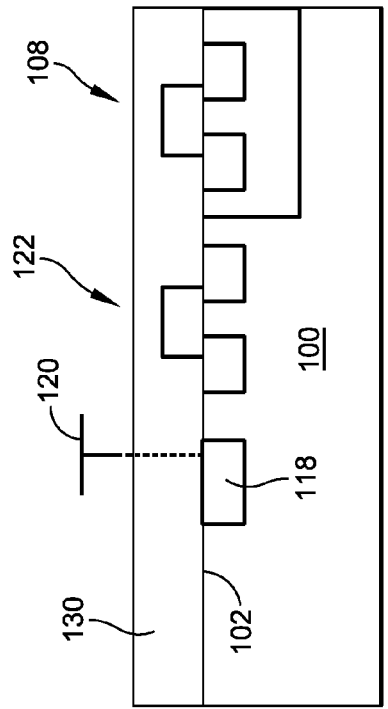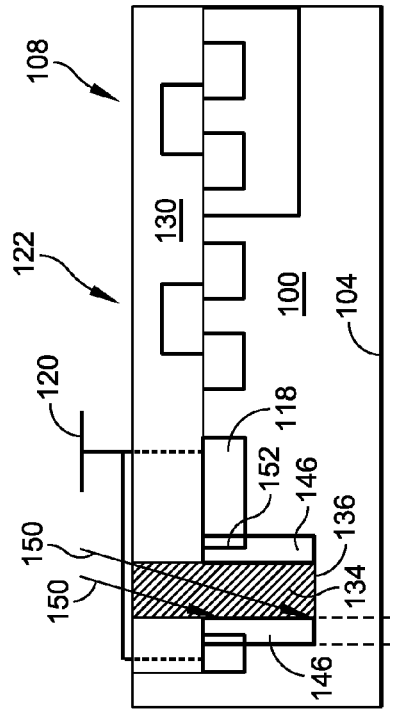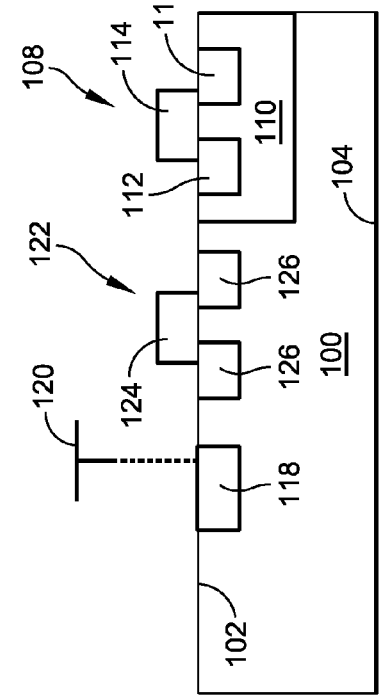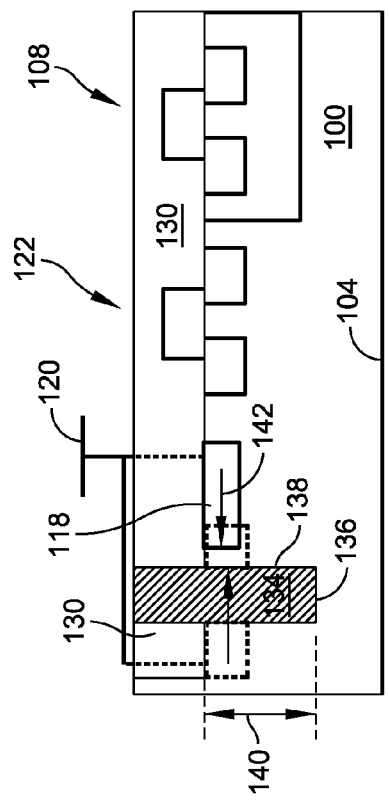
FIG. 2A
FIG. 2B
FIG. 2C
FIG. 2D

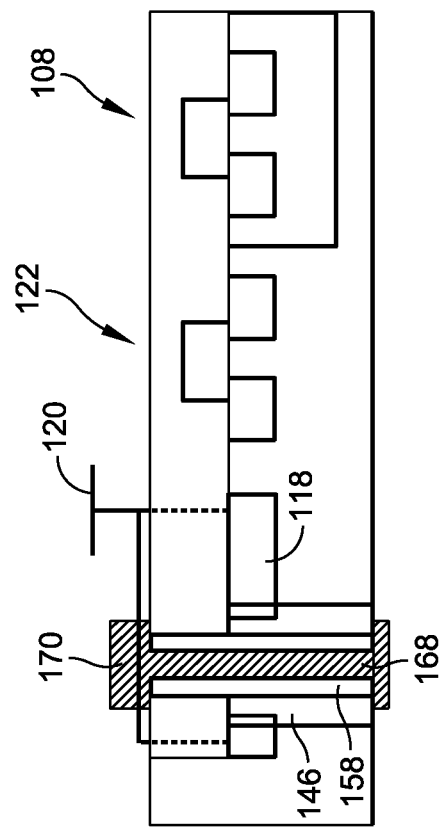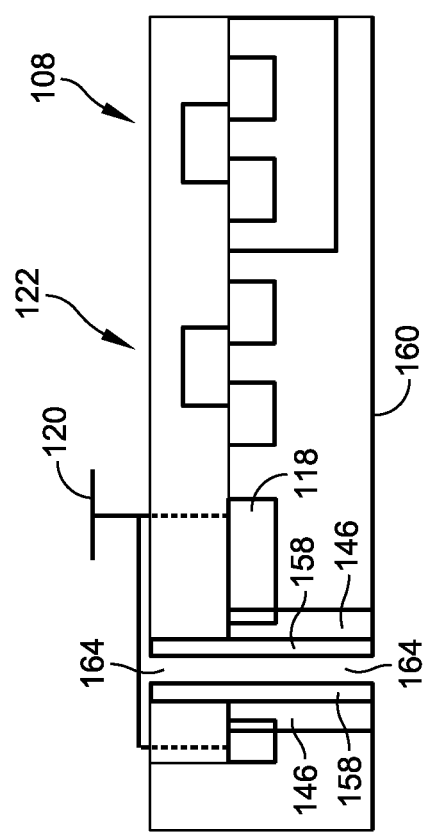

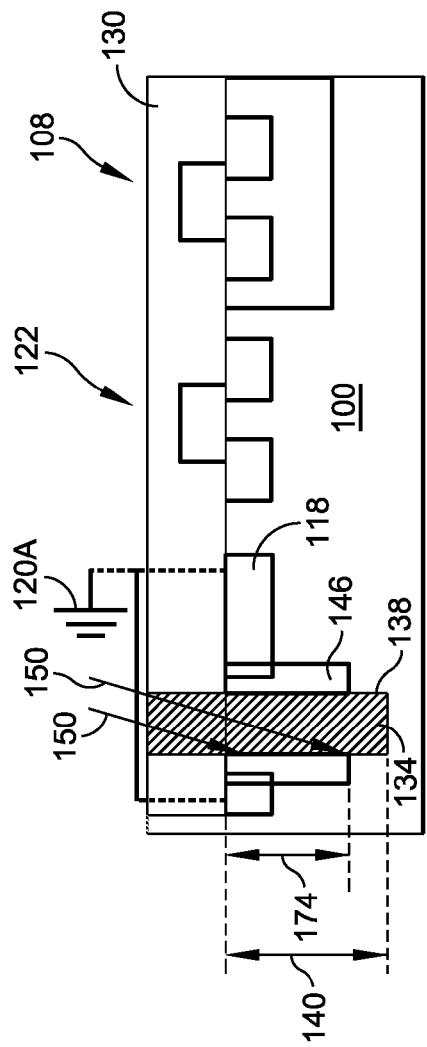
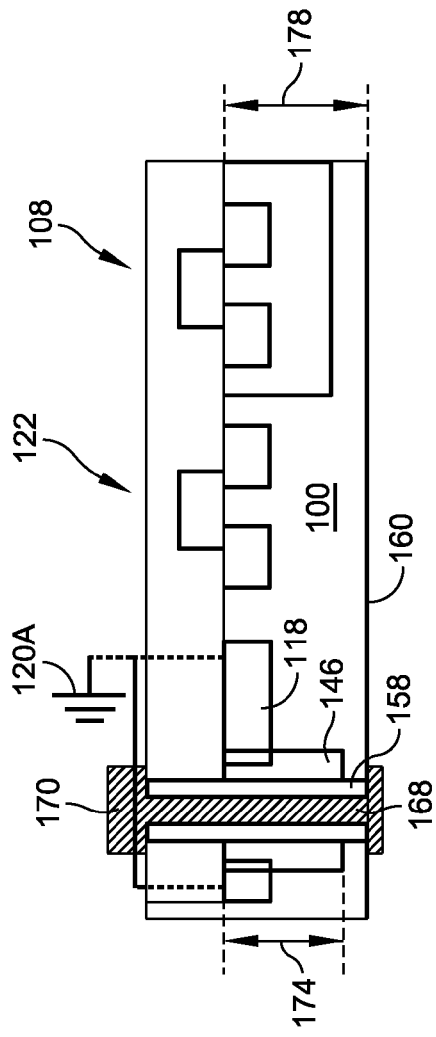
FIG. 3A
FIG. 3B

THROUGH SILICON VIA (TSV) ISOLATION STRUCTURES FOR NOISE REDUCTION IN 3D INTEGRATED CIRCUIT

TECHNICAL FIELD

The disclosure relates, most generally, to semiconductor devices and methods for manufacturing the same and the disclosure is more particularly directed to 3D integrated circuits, and structures and methods for noise isolation for through silicon vias.

BACKGROUND 3D (three dimensional) integrated circuits have become very popular in recent years due to the increased levels of integration they provide. 3D integrated circuits utilize through silicon via (TSV) structures which are via openings that extend completely through a semiconductor substrate and enable devices above and below the substrate to be coupled to one another and to devices internal to the substrate and provide the interconnects compatible with 3D wafer level packaging. When filled, the TSV structures may serve as signal lines or other purposes. Signal lines can carry and create significant amounts of electrical noise that adversely affects semiconductor devices such as active transistors, in their vicinity.

It would therefore be desirable to take advantage of the advanced integration levels afforded by 3D integrated circuits using TSV structures while avoiding problems associated with electrical noise created by such TSV structures.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 2A-2F are cross-sectional views showing a sequence of processing operations for forming exemplary TSV isolation structures according to the disclosure;

FIGS. 3A and 3B are cross-sectional views illustrating features of another exemplary TSV isolation structure according to the disclosure;

DETAILED DESCRIPTION

Figure 1:
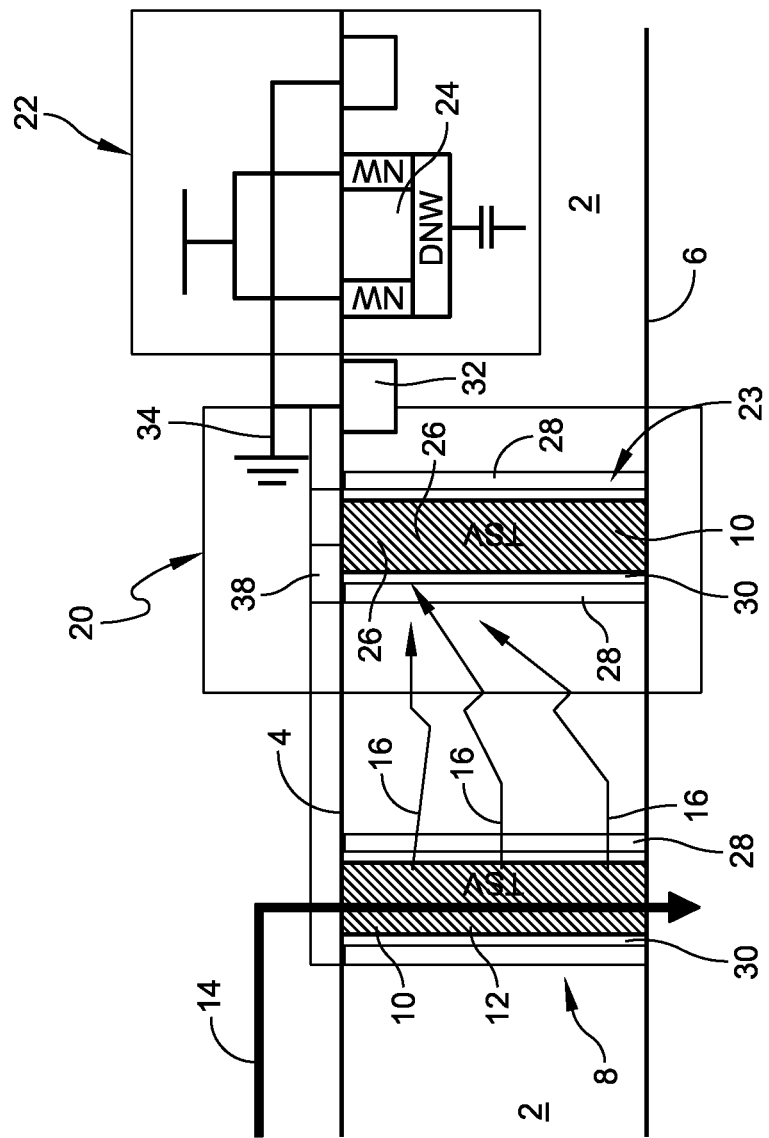
FIG. 1 is a cross-sectional view showing an exemplary embodiment of a TSV isolation structure according to the disclosure.

FIG. 1 is a cross-sectional view showing one exemplary aspect of the disclosure. FIG. 1 shows semiconductor substrate 2 which may be a P-type semiconductor substrate according to one exemplary embodiment and may be an N-type semiconductor substrate according to another exemplary embodiment. Semiconductor substrate 2 includes opposed surfaces including top surface 4 and opposed bottom surface 6. Semiconductor substrate 2 with bottom surface 6 is shown after a backgrinding or lapping process has been used to diminish the original thickness of semiconductor substrate 2 as will be shown in subsequent figures, for example in FIGS. 2A-2F. Still referring to FIG. 1, active through silicon via (TSV) 8 includes TSV opening 12 filled with conductive material 10 and carrying signal 14. Conductive material 10 may be copper, aluminum or other suitable materials and active TSV 8 enables wafer-to-wafer interconnect compatible with 3D wafer level packaging. Signal 14 may be a noisy signal. Noise is represented as electrical noise 16 which propagates through semiconductor substrate 2 and would adversely affect the performance of active semiconductor device 22 if not for the presence of isolation structure 20.

Active semiconductor device 22 includes transistor 24 in the illustrated embodiment but active semiconductor device 22 may be other active semiconductor devices in other exemplary embodiments. In exemplary embodiments in which active semiconductor device 22 is a transistor, it may be various different types of transistors such as a MOSFET (Metal Oxide Semiconductor Field Effect Transistor), a Fin-FET, or various other P-type or N-type transistors or other active semiconductor devices. The illustrated doping types and electrical connections of FIG. 1 are intended to be exemplary only.

Isolation structure 20 includes TSV isolation structure 23 which is formed of TSV opening 26 surrounded by surrounding dopant impurity region 28B and filled with conductive material 10. TSV openings 26 and 12 are formed simultaneously and may advantageously be filled with conductive material 10 simultaneously. The sidewalls of TSV openings 12 and 26 include oxide liner 30. Surrounding dopant impurity regions 28A and 28B surround TSV openings 12 and 26, respectively. The dopant impurity regions 28A, 28B may be P-type dopant impurity regions or N-type dopant impurity regions. In one embodiment, both dopant impurity regions 28A and 28B are P-type dopant impurity regions. In another embodiment, both dopant impurity regions 28A and 28B are N-type dopant impurity regions. In another embodiment, dopant impurity regions 28A and 28B are of different dopant impurity types. Surface dopant impurity region 32 may be an N-type dopant impurity region or a P-type dopant impurity region and will be the same dopant impurity type as surrounding dopant impurity region 28B according to various exemplary embodiments. In the illustrated embodiment, surface dopant impurity region 32 is advantageously a P+ dopant impurity region coupled to ground 34. According to the exemplary embodiment in which surface dopant impurity region 32 and surrounding dopant impurity region 28B are N-type dopant impurity regions, surface dopant impurity region 32 will be advantageously coupled to $V_{DD}$.

Still referring to FIG. 1, TSV isolation structure 23 is electrically coupled to surface dopant impurity region 32 and therefore also to ground 34 by conductive surface lead 38 because surrounding dopant impurity region 28B and surface dopant impurity region 32 are spaced apart, but it will be seen in other exemplary embodiments that surrounding dopant impurity region 28B may overlap surface dopant impurity region 32 and obviate the need for surface conductive lead 38.

Now turning to FIGS. 2A-2F, FIG. 2A shows semiconductor substrate 100 having top surface 102 and bottom surface 104. Semiconductor substrate 100 may be formed of silicon or other suitable materials and it may be a P-type or N-type material. Active semiconductor device 108 is formed in and on top surface 102 and includes well region 110, source/drain regions 112, and gate 114 and active semiconductor device 108 is a transistor in the illustrated exemplary embodiment.

Active semiconductor device 122 includes gate 124 and source/drain regions 126. Active semiconductor devices 108, 122 are intended to be exemplary only. Also formed extending downwardly from top surface 102 is surface dopant impurity region 118 which will be coupled to electrical coupling 120, the dashed line indicating that the coupling has not yet been made. Surface dopant impurity region 118 may be an N-type dopant impurity region or it may be a P-type dopant impurity region. According to the embodiment in which surface dopant impurity region 118 is an N-type dopant impurity region, electrical coupling 120 will be to $V_{DD}$ and according to the exemplary embodiment in which surface dopant impurity region 118 is a P-type dopant impurity region, electrical coupling 120 will be to ground.

FIG. 2B shows the structure of FIG. 2A after dielectric layer 130 has been formed over top surface 102. Various suitable materials such as used as interlevel dielectric layers may be used as dielectric layer 130. A photoresist layer may be formed over dielectric layer 130 and patterned and a subsequent etching process may be carried out to form the structure shown in FIG. 2C.

FIG. 2C shows the structure of FIG. 2B after via opening 134 has been formed extending downwardly from top surface 102. Various etching processes may be used. Via opening 134 includes bottom 136 that does not reach bottom surface 104 at this stage of processing and also extends through dielectric layer 130. Via opening 134 may include a width of about 4-10 microns and the width may be about 6 microns in one exemplary embodiment. Depth 140 may take on various values and may range from about 50-80 microns, preferably 60 microns, in one exemplary embodiment. It should be noted that the expressed values for the width and for depth 140, are exemplary only. Via opening 134 is spaced from surface dopant impurity region 118 by spacing 142 which may be various distances in various exemplary embodiments. Spacing 142 will determine whether the surrounding dopant impurity region to be formed as shown in FIG. 2D, will overlap with surface dopant impurity region 118. A further via opening (not shown) is advantageously formed to the left of via opening 134 in the illustration of FIG. 2C, the further via opening to serve as an active, signal carrying TSV (such as TSV opening 12 shown in FIG. 1) that will be isolated from active semiconductor devices 108, 122 by the TSV isolation structure to be formed using via opening 134.

FIG. 2D shows surrounding dopant impurity region 146 surrounding via opening 134 and extending downwardly to bottom 136. Various methods may be used to form surrounding dopant impurity region 146 which may be an N-type or P-type region. In the exemplary embodiment, surrounding dopant impurity region 146 overlaps surface dopant impurity region 118 at overlap region 152. Surrounding dopant impurity region 146 and surface dopant impurity region 118 will advantageously be of the same dopant type. In one exemplary embodiment, an angled ion implantation process may be used to introduce dopant impurities into substrate 100 around via opening 134 to form surrounding dopant impurity region 146. This is illustrated by arrows 150 illustrative of an angled ion implantation process. Angled ion implantation processes are known in the art. According to another exemplary embodiment, a plasma doping operation may be used to form surrounding dopant impurity regions 146 and the plasma doping process may be carried out in-situ with the etching operation used to form via opening 134, or separately. According to either the angled ion implantation doping embodiment or the plasma doping embodiment, the doping operation may be carried out with patterned dielectric layer 130 still in place and also with a photoresist layer used to pattern dielectric layer 130, still in place. Various other methods for introducing dopant impurities into sidewalls 138 of via opening 134 may be used. Surrounding dopant impurity region 146 may include various depths and in one exemplary embodiment, thickness 154 may range from about 10 to about 30 microns.

According to the embodiment in which a further via opening is advantageously formed to the left of via opening 134, the doping operation simultaneously forms surrounding dopant impurity regions of the same impurity type around the further via opening, in one embodiment. The further via opening may be an active, signal carrying TSV such as TSV opening 12 shown in FIG. 1, in one embodiment. In another embodiment in which a further via opening (not shown) is advantageously formed to the left of via opening 134, two separate doping operations may be used. In particular, two different doping operations may be used in conjunction with an interceding patterning operation, to separately form one of the surrounding dopant impurity regions to include a first impurity type and the other of the surrounding dopant impurity regions to include a second impurity type which may be the opposite impurity type.

The structure in FIG. 2E shows the structure of FIG. 2D after a thermal oxidation process has been carried out to form oxide liner 158 and after a backgrinding or backlapping operation has been carried out to upwardly recede the bottom surface of semiconductor substrate 100. The thickness of semiconductor substrate 100 is diminished by the backgrinding or backlapping operation and backgrinded surface 160 results. The via opening (134) that had extended into semiconductor substrate 100 now extends completely through semiconductor substrate 100 forming TSV opening 164.

TSV opening 164 will be substantially filled with a conductive material such as conductive material 168 such as shown in FIG. 2F. TSV isolation structure 170 includes oxide liner 158, surrounding dopant impurity region 146 and TSV opening 164 filled with conductive material 168 and will serve as a TSV isolation structure 170 as it is coupled to electrical coupling 120 through substrate dopant impurity region 118. In other exemplary embodiments, surrounding dopant impurity region 146 does not overlap with surface dopant impurity region 118. When surface dopant impurity region 118 is an N-type dopant impurity region, electrical coupling 120 is to $V_{DD}$ and when surface dopant impurity region 118 is a P-type dopant material, electrical coupling 120 will be ground. As discussed supra, TSV isolation structure 170 isolates active semiconductor devices 108, 122 from electrical noise such as may be generated by a signal carrying active TSV disposed to the left of TSV isolation structure 170.

According to the embodiment in which a further via opening (not shown in FIG. 2E) is formed to the left of via opening 134, the thermal oxidation process and backgrinding or backlapping operations that are performed as described above, will also produce an oxide liner around the further via opening such as oxide liner 30 surrounding TSV opening 12 as in FIG. 1.

FIGS. 3A and 3B are cross-sectional views showing another exemplary embodiment, FIG. 3A representing the same step such as the processing step illustrated in FIG. 2D and FIG. 3B illustrating the same process step such as the process step illustrated in FIG. 2F. In FIG. 3A, depth 174 of surrounding dopant impurity region 146 is less than depth 140 of via opening 134. FIG. 3A also shows the electrical connection as ground connection 120A such as used according to the exemplary embodiment in which surface dopant impurity region 118 is a P-type dopant impurity. The structure illustrated in FIG. 3B is then produced after at least an oxidation process, a backgrinding process and a conductive material formation process are carried out upon the structure shown in FIG. 3A. The exemplary structure shown in FIG. 3B differs from the exemplary embodiment shown in FIG. 2F because TSV isolation structure 170 including oxide liner 158 extends through semiconductor substrate 100 and reaches back-grinded surface 160, however surrounding dopant impurity region 146 does not extend to backgrinded surface 160. Depth 174 of surrounding dopant impurity region 146 is less than thickness 178 of the backgrinded semiconductor substrate 100.

Figure 4:
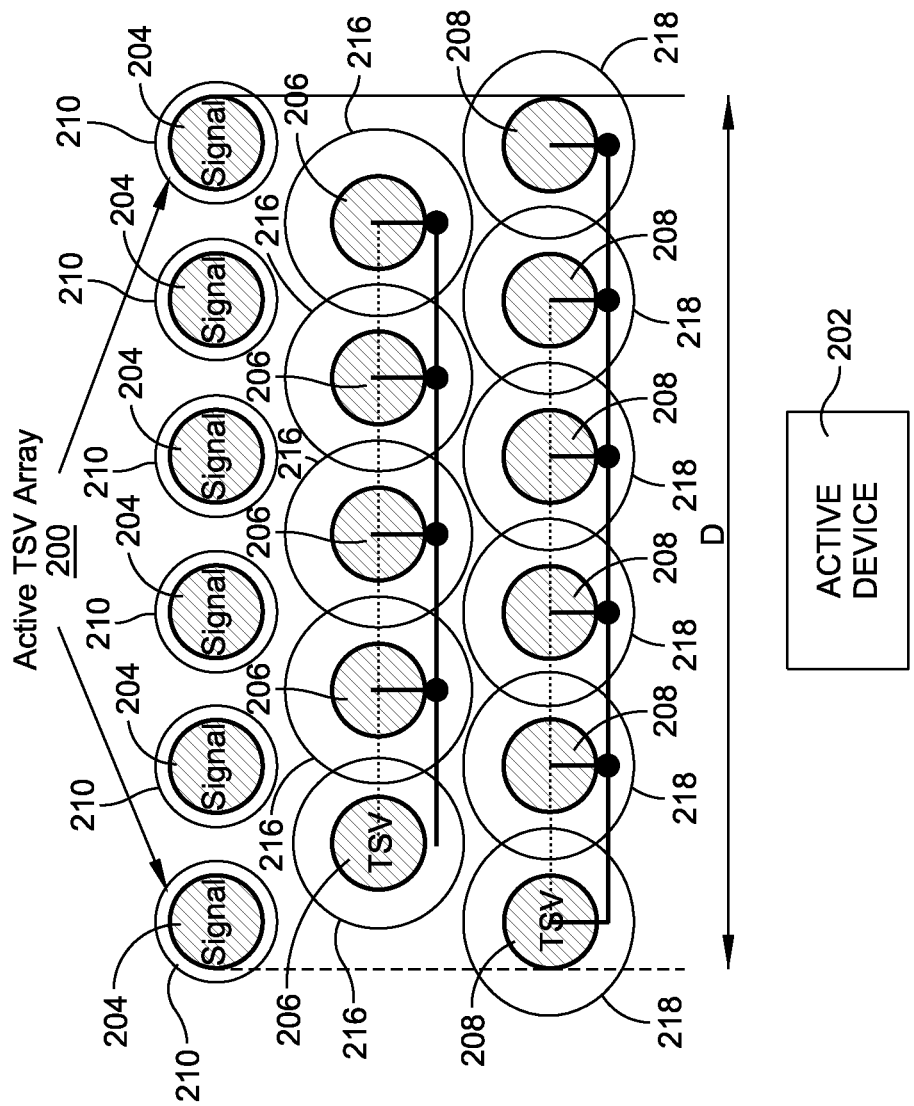
FIG. 4 is a plan view showing a layout pattern of an array of TSV isolation structures providing isolation to an active, signal carrying TSV.
Figure 5:
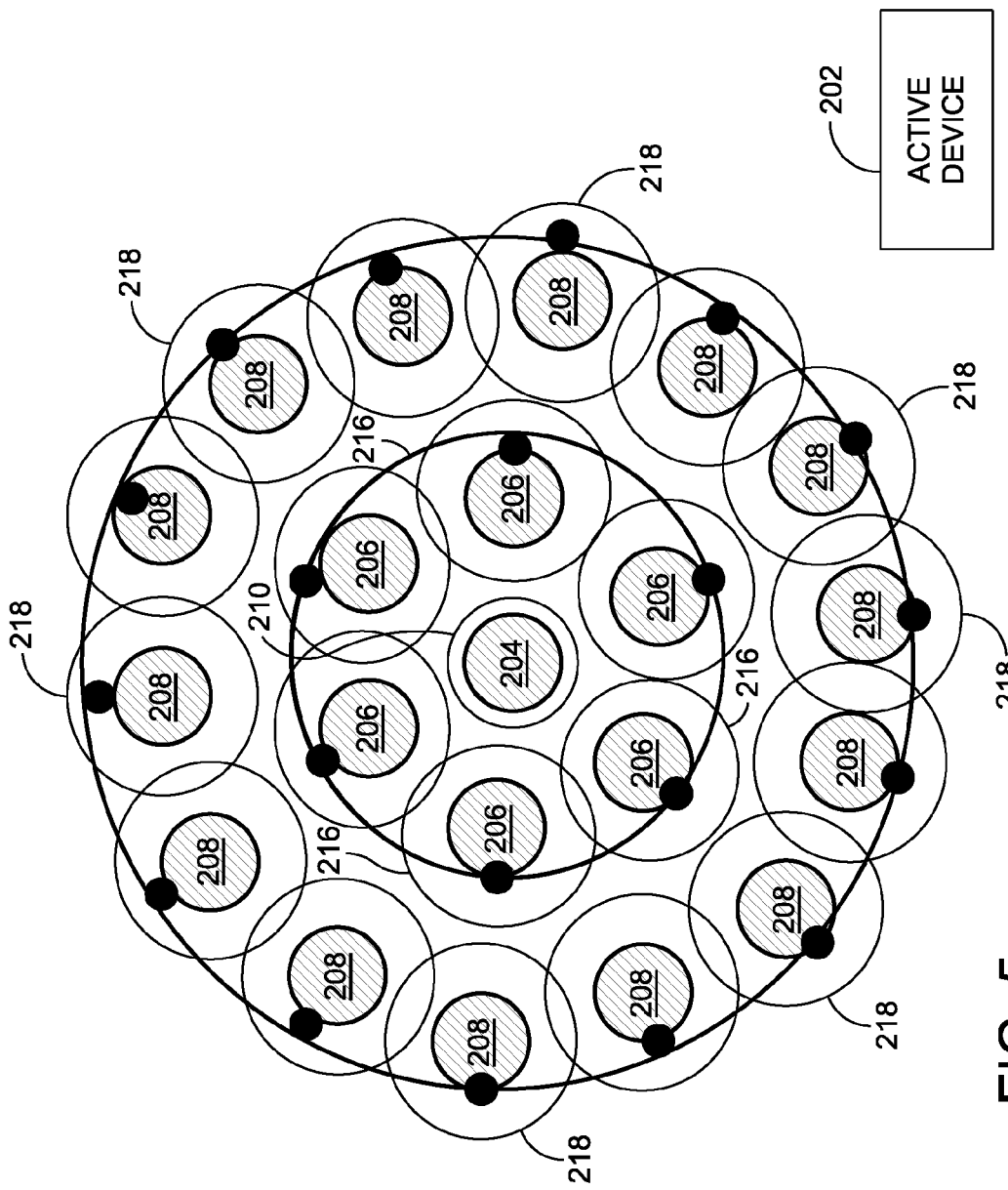
FIG. 5 is another plan view showing a layout pattern of an array of TSV isolation structures providing isolation to an active, signal carrying TSV.

FIGS. 4 and 5 are top views illustrating two exemplary embodiments of arrays of TSV isolation structures used to isolate active TSV structures from active semiconductor devices. FIG. 4 shows array configuration 200 and FIG. 5 shows array configuration 220. In each array, active TSVs 204 are separated from active semiconductor devices 202 by one or more TSV isolation structures arranged in an array. Active TSVs 204 are TSVs that carry signals or perform other active electrical functions and may include surrounding dopant impurity regions 210, although surrounding dopant impurity regions 210 may not be present in some embodiments. In FIG. 4, array configuration 200 includes a row of TSV isolation structures 206 including surrounding dopant impurity regions 216 and a row of TSV isolation structures 208 with surrounding dopant impurity regions 218. FIG. 5 shows an inner ring of TSV isolation structures 206 with surrounding dopant impurity regions 216 and an outer ring of TSV isolation structures 208 with corresponding surrounding dopant impurity regions 218.

Referring to FIGS. 4 and 5, according to a first embodiment, TSV isolation structures 206 may be N-type TSV isolation structures with corresponding surrounding dopant impurity regions 216 being N-type dopant impurity regions coupled to $V_{DD}$ with TSV isolation structures 208 being P-type TSV isolation structures with corresponding surrounding dopant impurity regions 218 being P-type dopant impurity regions coupled to ground. According to this first embodiment, surrounding dopant impurity region 210 may be either P-type or N-type dopant impurity regions. According to another exemplary embodiment, surrounding dopant impurity region 210, and each of TSV isolation structures 206 and 208 and corresponding surrounding dopant impurity regions 216 and 218 are P-type dopant impurity regions coupled to ground. According to yet another exemplary embodiment, surrounding dopant impurity region 210, and each of TSV isolation structures 206 and 208 and corresponding surrounding dopant impurity regions 216 and 218 are N-type dopant impurity regions coupled to $V_{DD}$. According to yet another exemplary embodiment, TSV isolation structures 206 may be P-type TSV isolation structures with corresponding surrounding dopant impurity regions 216 being P-type dopant impurity regions coupled to ground with TSV isolation structures 208 being N-type TSV isolation structures with corresponding surrounding dopant impurity regions 218 being N-type dopant impurity regions coupled to $V_{DD}$. According to this embodiment, surrounding dopant impurity regions 210 may be either P-type or N-type dopant impurity regions.

Active semiconductor device 202 may represent one or a plurality of any of various active semiconductor devices that may be formed within an integrated circuit and it should be understood that the configurations of the arrays shown in FIGS. 4 and 5 are intended to be exemplary only and may take other shapes in other exemplary embodiments.

According to one aspect, a semiconductor device is provided. The semiconductor device comprises an active semiconductor device formed on a surface of a semiconductor substrate and an isolation through silicon via (TSV) extending through the semiconductor substrate and laterally spaced from the active semiconductor device and next to a surface dopant impurity region of a first dopant impurity type formed in the surface between the isolation TSV and the active semiconductor device. The semiconductor device further comprises an isolation TSV surrounded laterally by a surrounding dopant impurity region, the surrounding dopant impurity region being one of a P-type dopant impurity region coupled to ground and an N-type dopant impurity region coupled to $V_{DD}$.

According to another aspect, provided is a method for forming a semiconductor device. The method comprises: providing a semiconductor substrate with a surface having an active semiconductor device disposed thereon and a surface dopant impurity region of a first dopant impurity type disposed therein; forming a through silicon via (TSV) opening next to the surface dopant impurity region and extending downwardly from the surface and into the semiconductor substrate, the surface dopant impurity region disposed between the TSV opening and the active semiconductor device; forming a surrounding dopant impurity region surrounding the TSV opening, the surrounding dopant impurity region being one of a P-type dopant impurity region and an N-type dopant impurity region; and electrically coupling the surrounding dopant impurity region by one of coupling the P-type dopant impurity region to ground when the surrounding dopant impurity comprises a P-type dopant impurity region, and coupling the N-type dopant impurity region to $V_{DD}$ when the surrounding dopant impurity comprises an N-type dopant impurity region.

According to another aspect, a method for forming a semiconductor device is provided. The method comprises providing a semiconductor substrate with a surface having an active semiconductor device disposed thereon; forming a plurality of through silicon vias (TSV) extending through the semiconductor substrate, the plurality of TSVs including an active TSV including a conductive structure carrying an electrical signal therein, an array of N-type TSV isolation structures surrounded by corresponding N-type surrounding dopant impurity regions and an array of P-type TSV isolation structures surrounded by corresponding P-type surrounding dopant impurity regions; and coupling the N-type TSV isolation structures to $V_{DD}$ and coupling the P-type TSV isolation structures to ground, wherein the active TSV is separated from the active semiconductor device by at least some of the N-type TSV isolation structures and the P-type TSV isolation structures.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A semiconductor device comprising:
    an active semiconductor device formed on a surface of a semiconductor substrate;
    an isolation through silicon via (TSV) extending through said semiconductor substrate and laterally spaced from said active semiconductor device and next to a surface dopant impurity region of a first dopant impurity type disposed in said surface between said isolation TSV and said active semiconductor device, said surface dopant impurity region having a dopant concentration different from said substrate; and
    said isolation TSV surrounded laterally by a surrounding dopant impurity region that forms sidewalls of said isolation TSV, said surrounding dopant impurity region being one of a P-type dopant impurity region coupled to ground and an N-type dopant impurity region coupled to $V_{DD}$.

2. The semiconductor device as in claim 1, wherein said isolation TSV further includes an oxide liner formed on said sidewalls, said surrounding dopant impurity region surrounds said oxide liner and each of said surrounding dopant impurity region and said oxide liner extend from said surface to a bottom surface of said semiconductor substrate.

3. The semiconductor device as in claim 1, further comprising an active TSV containing a conductive line carrying a signal and extending through said semiconductor substrate, said isolation TSV interposed between said active TSV and said active semiconductor device and wherein said active semiconductor device comprises a transistor.

4. The semiconductor device as in claim 3, further comprising a plurality of further isolation TSVs forming an array, said active TSV surrounded by said array and isolated from said transistor by said array.

5. The semiconductor device as in claim 3, wherein said active TSV includes an oxide liner formed on sidewalls thereof and a surrounding dopant impurity region that laterally surrounds said oxide liner.

6. The semiconductor device as in claim 1, wherein said first dopant impurity type comprises P-type, said surrounding dopant impurity region comprises said P-type dopant impurity region coupled to ground and overlaps with said surface dopant impurity region of said first dopant impurity type, and said isolation TSV contains a copper lead therein.

7. The semiconductor device as in claim 1, wherein said first dopant impurity type comprises N-type and said surrounding dopant impurity region comprises said N-type dopant impurity region coupled to $V_{DD}$.

8. The semiconductor device as in claim 7, wherein said surrounding dopant impurity region overlaps with said surface dopant impurity region of said first dopant impurity type, said semiconductor substrate comprises a P-type material, said isolation TSV is coupled to $V_{DD}$ through said surface dopant impurity which is coupled to $V_{DD}$, and said isolation TSV contains a copper lead therein.

9. The semiconductor device as in claim 1, wherein said surrounding dopant impurity region extends from said surface to a termination location above a bottom surface of said semiconductor substrate.

10. The semiconductor device as in claim 1, wherein said isolation TSV is a P-type isolation TSV with said surrounding dopant impurity region comprising said P-type dopant impurity region coupled to ground and said first dopant impurity type comprising P-type and further comprising:
    a plurality of further of said P-type isolation TSVs and a plurality of N-type isolation TSVs, each said N-type isolation TSV having said surrounding dopant impurity region being an N-type dopant impurity region disposed next to a further N-type dopant impurity region and coupled to $V_{DD}$;
    an active TSV structure containing a conductive lead, carrying a signal and extending through said substrate, and
    wherein said active TSV structure is surrounded by an array of said N-type isolation TSVs and said array of N-type isolation TSVs is surrounded by an array of said P-type isolation TSVs.

11. A method for forming a semiconductor device, said method comprising:
    providing a semiconductor substrate with a surface having an active semiconductor device disposed thereon and a surface dopant impurity region of a first dopant impurity type disposed therein, said surface dopant impurity region having a dopant concentration different from said substrate;
    forming a through silicon via (TSV) opening next to said surface dopant impurity region and extending downwardly from said surface and into said semiconductor substrate, said surface dopant impurity region disposed between said TSV opening and said active semiconductor device;
    forming a surrounding dopant impurity region surrounding said TSV opening, said surrounding dopant impurity region being one of a P-type dopant impurity region and an N-type dopant impurity region; and
    electrically coupling said surrounding dopant impurity region by one of coupling said P-type dopant impurity region to ground when said surrounding dopant impurity comprises a P-type dopant impurity region, and coupling said N-type dopant impurity region to $V_{DD}$ when said surrounding dopant impurity comprises an N-type dopant impurity region.

12. The method as in claim 11, further comprising thermally oxidizing sidewalls of said TSV opening after said forming a surrounding dopant impurity region.

13. The method as in claim 12, wherein
    said first dopant impurity type comprises P-type, said surrounding dopant impurity region comprises said P-type dopant impurity region and overlaps said surface dopant impurity region of said first dopant impurity type, said semiconductor substrate comprises a P-type substrate, and said electrically coupling comprises filling said TSV isolation structure with a conductive material and coupling said TSV isolation structure to ground through said surface dopant impurity region.

14. The method as in claim 12, wherein said first dopant impurity type comprises N-type, said surrounding dopant impurity region comprises said N-type dopant impurity region and overlaps said surface dopant impurity region, said semiconductor substrate comprises a P-type substrate, and said electrically coupling comprises filling said TSV isolation structure with a conductive material and coupling said TSV isolation structure to $V_{DD}$ through said surface dopant impurity region.

15. The method as in claim 11, wherein said forming a surrounding dopant impurity region comprises angled ion implantation, and further comprising oxidizing sidewalls of said TSV opening to form an oxide liner thereon, after said angled ion implantation.

16. The method as in claim 11, wherein said forming a surrounding dopant impurity region comprises in-situ plasma doping and further comprising backgrinding an opposed backside surface of said semiconductor substrate such that said TSV opening extends completely through said substrate.

17. A method for forming a semiconductor device, said method comprising:

providing a semiconductor substrate with a surface having an active semiconductor device disposed thereon;

forming a plurality of through silicon vias (TSV) extending through said semiconductor substrate, said plurality of TSVs including an active TSV including a conductive structure carrying an electrical signal therein, an array of first TSV isolation structures surrounded by corresponding first surrounding dopant impurity regions and an array of second TSV isolation structures surrounded by corresponding second surrounding dopant impurity regions; and wherein said active TSV is separated from said active semiconductor device by at least some of said first TSV isolation structures and said second TSV isolation structures.

18. The method as in claim 17, wherein:

said first TSV isolation structures comprise a first one of N-type and P-type TSV isolation structures and said first surrounding dopant impurity regions comprise said first one of N-type and P-type surrounding dopant impurity regions;

said second TSV isolation structures comprise the other of N-type and P-type TSV isolation structures said second surrounding dopant impurity regions comprise said other of N-type and P-type surrounding dopant impurity regions; and further comprising coupling said N-type TSV isolation structures to $V_{DD}$ and coupling said P-type TSV isolation structures to ground.

19. The method as in claim 18, further comprising forming N-type surface dopant impurity regions adjacent and overlapping said N-type surrounding dopant impurity regions and forming P-type surface dopant impurity regions adjacent and overlapping said P-type surrounding dopant impurity regions, and wherein said coupling said N-type TSV isolation structures comprises coupling said N-type surface dopant impurity regions to $V_{DD}$ and wherein said coupling said P-type TSV isolation structures comprises coupling said P-type surface dopant impurity regions to ground.

20. The method as in claim 17, wherein said forming a plurality of TSVs includes said active TSV surrounded by a corresponding active TSV surrounding dopant impurity region and etching to form via openings extending into said substrate and forming said corresponding first, second and active TSV surrounding dopant impurity regions using angled ion implantation, and further includes oxidizing sidewalls of said TSVs to form respective oxide liners, wherein said corresponding first, second and active TSV surrounding dopant impurity regions surround said respective oxide liners, and said first and second TSV isolation structures each comprise N-type or P-type isolation structures.

* * * * *